(12) United States Patent
Kim et al.

(10) Patent No.: US 9,259,805 B2
(45) Date of Patent: Feb. 16, 2016

(54) MASK FOR EVAPORATION, AND METHOD AND APPARATUS FOR MANUFACTURING THE SAME

(75) Inventors: Joon-Hyung Kim, Yongin (KR);
Young-Geun Cho, Yongin (KR);
Eui-Shin Shin, Yongin (KR);
Jong-Heon Kim, Yongin (KR);
Seung-Ho Choi, Yongin (KR);
Cheol-Lae Roh, Yongin (KR);
Chang-Mog Jo, Yongin (KR); Jae-Seok Park, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 1145 days.

(21) Appl. No.: 12/964,706

(22) Filed: Dec. 9, 2010

(65) Prior Publication Data
US 2011/0139365 A1    Jun. 16, 2011

(30) Foreign Application Priority Data

Dec. 14, 2009  (KR) .......................... 10-2009-0124209

(51) Int. Cl.
*B32B 37/04* (2006.01)
*B05C 11/11* (2006.01)
(Continued)

(52) U.S. Cl.
CPC ............. *B23K 26/422* (2013.01); *B23K 26/032* (2013.01); *B23K 26/0656* (2013.01); *B23K 26/0661* (2013.01); *H01L 51/0011* (2013.01)

(58) Field of Classification Search
USPC .......... 156/272.8, 345.51; 118/504, 503, 500, 118/728; 355/290, 285, 216; 219/121.83, 219/121.73; 382/141, 144
See application file for complete search history.

(56) References Cited

U.S. PATENT DOCUMENTS 3,816,696 A * 6/1974 Wheeler et al. .......... 219/124.21
4,623,777 A * 11/1986 Aihara et al. ............. 219/121.6
(Continued)

FOREIGN PATENT DOCUMENTS

JP    61-88989 A    5/1986
JP    2004-091830 A    3/2004
(Continued)

OTHER PUBLICATIONS

Machine Generated Translation of KR 10-20080058602 published Jun. 26 2008.*
(Continued)

*Primary Examiner* — Sylvia R MacArthur
(74) *Attorney, Agent, or Firm* — Robert E. Bushnell, Esq.

(57) ABSTRACT

Provided is a mask for an evaporation apparatus, which includes a first division mask and a second division mask. The first and second division masks are directly bonded to each other by welding, thereby forming welding portion between the first and the second division masks. A method and apparatus for manufacturing a mask for evaporation are also provided. The division masks according to the embodiment do not use subframes, and are directly bonded to one another by welding, so that a shadow effect does not occur. The apparatus for manufacturing a mask for evaporation includes a work stage, a clamp fixing a first division mask and a second division mask to the work stage, and a laser welding part welding the first division mask to the second division mask. The apparatus may further include a first roller leading the laser welding part and a second roller following the laser welding part.

11 Claims, 6 Drawing Sheets

(51) Int. Cl.
*B23K 26/30* (2014.01)
*B23K 26/03* (2006.01)
*B23K 26/06* (2014.01)
*H01L 51/00* (2006.01)

(56) References Cited

U.S. PATENT DOCUMENTS

| | | | | |
|---|---|---|---|---|
| 4,990,741 | A * | 2/1991 | Moores et al. | 219/121.64 |
| 5,205,468 | A * | 4/1993 | Budenbender | 228/164 |
| 5,595,670 | A * | 1/1997 | Mombo-Caristan | 219/121.64 |
| 5,674,420 | A * | 10/1997 | Broderick et al. | 219/158 |
| 5,961,859 | A * | 10/1999 | Chou et al. | 219/121.63 |
| 6,084,223 | A * | 7/2000 | Dietz et al. | 219/617 |
| 6,373,027 | B1 * | 4/2002 | Jeong | 219/158 |
| 2004/0112519 | A1 * | 6/2004 | Mori | 156/272.8 |
| 2005/0072829 | A1 * | 4/2005 | Wildmann et al. | 228/49.4 |
| 2007/0289955 | A1 * | 12/2007 | Tsukamoto et al. | 219/121.64 |
| 2008/0128053 | A1 * | 6/2008 | Jansen et al. | 148/400 |
| 2008/0173392 | A1 * | 7/2008 | Tanaka et al. | 156/272.8 |
| 2011/0043917 | A1 * | 2/2011 | Bayramian et al. | 359/569 |

FOREIGN PATENT DOCUMENTS

| | | |
|---|---|---|
| JP | 2008-183604 | 8/2008 |
| KR | 10-2007-0027300 | 3/2007 |
| KR | 10-0830321 | 5/2008 |
| KR | 10-2008-0054741 A | 6/2008 |
| KR | 10-2008-0057570 | 6/2008 |
| KR | 10-2008-0058602 | 6/2008 |
| KR | 10-2009-0034567 A | 4/2009 |

OTHER PUBLICATIONS

Machine Generated Translation of KR 10-20070027300 published Mar. 9, 2007.*
Machine Generated Translation of JP2004-091830 published Mar. 25, 2004.*
Machine Generated Translation of KR 10-2009-0034567 published Apr. 8, 2009.*
Machine Generated Translation KR 1020080054741 published Jun. 19, 2008.*
Machine Generated Translation KR 1020080057570 published Jun. 25, 2008.*

* cited by examiner

MASK FOR EVAPORATION, AND METHOD AND APPARATUS FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 14 Dec. 2009 and there duly assigned Serial No. 10-2009-0124209.

BACKGROUND OF THE INVENTION

1. Field of the Invention

Aspects of the present invention relate to a mask for evaporation including a first division mask and a second division mask, and a method and apparatus for manufacturing the same.

2. Description of the Related Art

Generally, an organic light emitting diode (OLED) includes an organic layer interposed between a first electrode (i.e., an anode) and a second electrode (i.e., a cathode). The first electrode is a transparent electrode formed of, for example, indium tin oxide (ITO), and the second electrode is formed of a metal having a low work function, such as Ca, Li, or Al. When a forward voltage is applied to the OLED, holes emitted from the anode combine with electrons emitted from the cathode to form excitons, and while the excitons are making the transition from an excited state to a ground state, light is emitted.

The second electrode is generally formed as a reflective electrode that reflects light, while the first electrode is generally formed as a transmissive electrode that transmits light. Thus, an OLED emitting light emitted from the organic layer to the second electrode may be manufactured.

Here, the organic layer may be formed by various methods. One of the methods is an evaporation method. To manufacture an OLED display device by an evaporation method, a mask having the same pattern as a thin film to be formed is attached to a surface on which the thin film will be formed, and a material for the thin film is evaporated to form the thin film having a predetermined pattern.

Meanwhile, as a flat panel display becomes larger, such a mask also becomes larger. For example, in current manufacturers of masks, a mask corresponding to a size of a 5.5 G substrate (1320 mm×1500 mm) cannot be manufactured, and thus a division mask should be used.

Generally, such a division mask is formed by equally quartering a mask frame into lattice-type subframes, and bonding masks disposed to correspond to divided openings by welding.

However, the method of equally dividing the mask frame into the subframes and bonding the masks to the divided openings by welding leads to a shadow effect due to the subframe. Thus, it is difficult to perform uniform evaporation.

SUMMARY OF THE INVENTION

Aspects of the present invention provide a mask for evaporation which does not have a shadow effect due to a subframe so that a larger mask can be manufactured.

According to an aspect of the present invention, a mask for evaporation includes a first division mask, a second division mask, and a welding portion formed between the first division mask and the second division mask. The first and second division masks are bonded to each other through the welding portion.

The welding portion may have burrs around an interface between the welding portion and the first division mask and around an interface between the welding portion and the second division mask. A height of the burrs may be about 10 µm or less.

A gap between the first and second division masks may be about 10% or less of a thickness of the mask.

According to another aspect of the present invention, a method of manufacturing a mask for evaporation includes disposing a first division mask and a second division mask on a top surface of a work stage, fixing the first and second division masks to the work stage with clamps, disposing a pressing plate on peripheral regions of the first and second division masks to be welded, and welding the first division mask to the second division mask with a laser welding part.

The disposing the first division mask and the second division mask may comprise disposing a master substrate on the top surface of the work stage, and aligning the first division mask and the second division mask to the master substrate.

A gap may be formed between the first and second division masks, and the gap may be about 10% or less of a thickness of the first division mask.

The method may further comprise pressing the first and second divisional masks onto the work stage with a first roller while moving into a welding direction. The first roller may lead the laser welding part.

A welding portion may be formed between the first division mask and the second division mask after welding the first division mask to the second division mask. The method may further comprise planarizing a top surface of the welding portion with a second roller while moving into a welding direction. The second roller may follow the laser welding part.

A beam profiler of a laser generated from the laser welding part may have a plurality of maximum peaks.

According to still another aspect of the present invention, an apparatus for manufacturing a mask for evaporation includes a work stage, a clamp disposed on the work stage, a pressing plate disposed on peripheral regions of the first and second division masks, and a laser welding part disposed above the first and second division masks. The clamp fixes a first division mask and a second division mask to a top surface of the work stage. The pressing plate presses the first and second division masks onto the work stage. The laser welding part welds the first division mask to the second division mask.

The apparatus may further include a master substrate disposed between the work stage and the first and second division masks.

A beam profiler of a laser generated from the laser welding part may have a plurality of maximum peaks. None of the maximum peaks may be at around a center of the beam profile of the laser.

The apparatus may further include a first roller positioned in front of the laser welding part and a second roller positioned behind the laser welding part. The first and second rollers disposed on the first and second division masks.

The apparatus may further include a supporter. The laser welding part and the first and second rollers may be installed in the supporter. The supporter may move along a welding direction while welding the first division mask to the second division mask. The first roller may lead the laser welding part and may press the first and second divisional masks onto the work stage. The second roller may follow the laser welding part and may planarize a surface of a welding portion formed between the first and second division masks during the welding the first division mask to the second division mask.

Additional aspects and/or advantages of the invention will be set forth in part in the description which follows and, in part, will be obvious from the description, or may be learned by practice of the invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
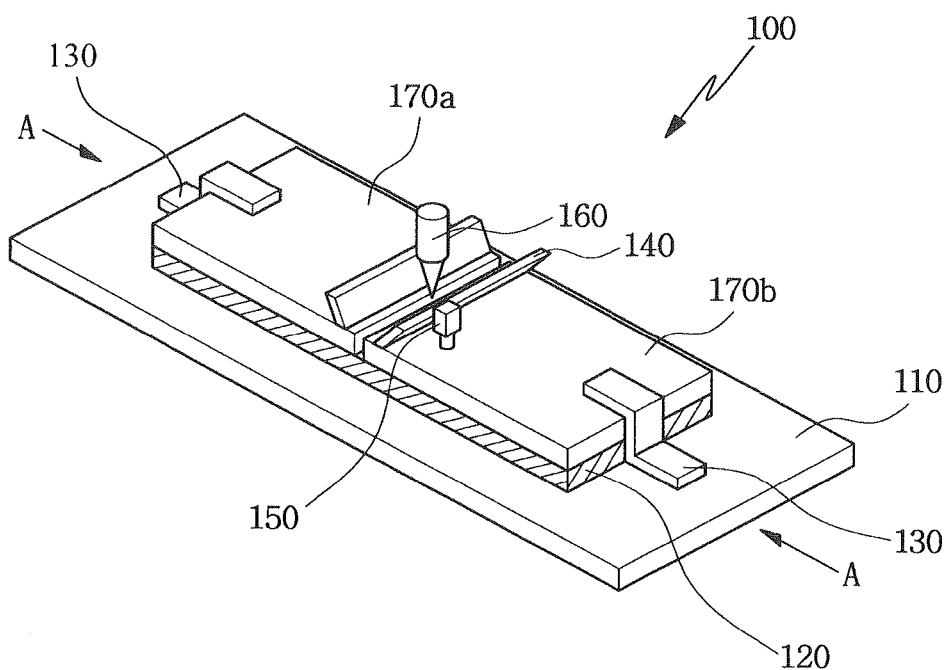
FIG. 1A is a schematic perspective view of an apparatus for manufacturing a mask for evaporation according to an embodiment.

Generally, an organic light emitting diode (OLED) includes an organic layer interposed between a first electrode (i.e., an anode) and a second electrode (i.e., a cathode). The first electrode is a transparent electrode formed of, for example, indium tin oxide (ITO), and the second electrode is formed of a metal having a low work function, such as Ca, Li, or Al. When a forward voltage is applied to the OLED, holes emitted from the anode combine with electrons emitted from the cathode to form excitons, and while the excitons are making the transition from an excited state to a ground state, light is emitted. The first electrode is generally formed as a reflective electrode that reflects light, while the second electrode is generally formed as a transmissive electrode that transmits light. Thus, an OLED emitting light emitted from the organic layer to the second electrode may be manufactured. Here, the organic layer may be formed by various methods., one One of the methods which is an evaporation method. To manufacture an OLED display device by using an evaporation method, a mask having the same pattern as a thin film to be formed is attached to a surface on which the thin film will be formed, and a material for the thin film is evaporated to form the thin film having a predetermined pattern.

The present invention will now be described more fully hereinafter with reference to the accompanying drawings, in which exemplary embodiments of the invention are shown. Like numerals denote the like elements throughout the specifications, and when one part is "connected with another part, these parts may be "directly connected" with each other, or "electrically connected" with each other having a third device therebetween. Moreover, in the drawings, thicknesses of layers and regions are exaggerated for clarity.

Figure 6:
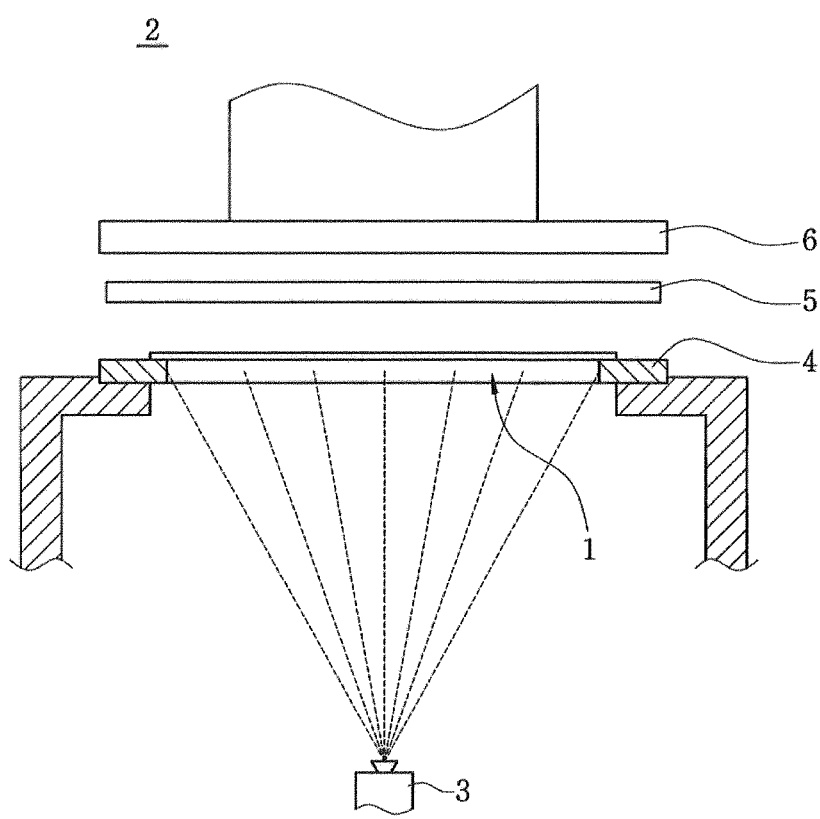
FIG. 6 is a schematic cross-sectional view of an evaporation apparatus including the mask for evaporation.

FIG. 6 is a cross-sectional view schematically showing an evaporation apparatus 2 including a mask used in an evaporation method. The evaporation apparatus 2 is disposed inside a vacuum chamber.

Referring to FIG. 6, to evaporate a material for an organic layer, which includes a thin film, i.e., an emission layer, of the OLED display device, using a mask 1, a frame 4 coupled to the mask 1 is installed in front of a crucible 3, which contains a material for a thin film. A subject 5, on which a thin film will be formed, is disposed behind the frame 4. A magnet unit 6 is disposed behind the subject 5. The magnet unit 6 supports the subject 5, and drives the subject 5 towards the mask 1, which is coupled to the frame 4. At this time, a material contained in the cubicle 3 is evaporated onto the subject 5 by operation of the crucible 3 for evaporating the thin film.

Figure 1B:
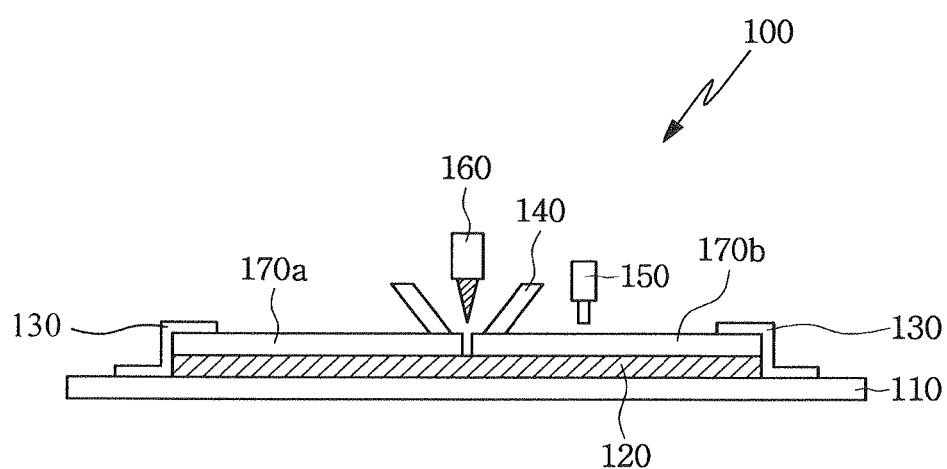
FIG. 1B is a cross-sectional view taken along a cross-sectional line A-A of FIG. 1A.

FIG. 1A is a schematic perspective view of an apparatus for manufacturing a mask for evaporation (referred to as an "evaporation mask") according to the embodiment, and FIG. 1B is a cross-sectional view taken along a cross-sectional line A-A of FIG. 1A.

Referring to FIGS. 1A and 1B, an apparatus 100 for manufacturing an evaporation mask according to the embodiment includes a master substrate 120 disposed on a work stage 110, a laser welding part 160, and a CCD camera 150.

A first division mask 170a and a second division mask 170b for manufacturing the evaporation mask according to the embodiment are disposed on the master substrate 120. In the drawings, two division masks are illustrated, but the number of the division masks may vary according to the size of the mask.

Meanwhile, clamps 130 are disposed on the work stage 110 to fix the first and second division masks to the work stage 110. That is, the clamp 130 is a fixing member for preventing movement of the division mask during the welding operation. In the drawings, a pair of clamps are illustrated, but a plurality of clamps may be included if necessary. Thus, the present invention is not limited to the number of the clamps or positions thereof shown in FIG. 1A.

The apparatus for manufacturing an evaporation mask according to the embodiment includes pressing plates 140 that are disposed on the work stage 110. Specifically, the pressing plates 140 are disposed on peripheral regions of the first and second division masks 170a and 170b, and press the first and second division masks onto the work stage. The peripheral regions of the first and second division masks are the edge portions of the first and second division masks to be welded together.

That is, the pressing plates 140 are provided for fine welding by keeping the peripheral regions of the division masks 170a and 170b to be welded close to each other. Each pressing plate is disposed on the first division mask region or the second division mask region. Meanwhile, as described above, when there are a plurality of division masks, a plurality of welding portion pressing plates may be disposed on the peripheral regions of the respective division masks to be welded.

Figure 2:
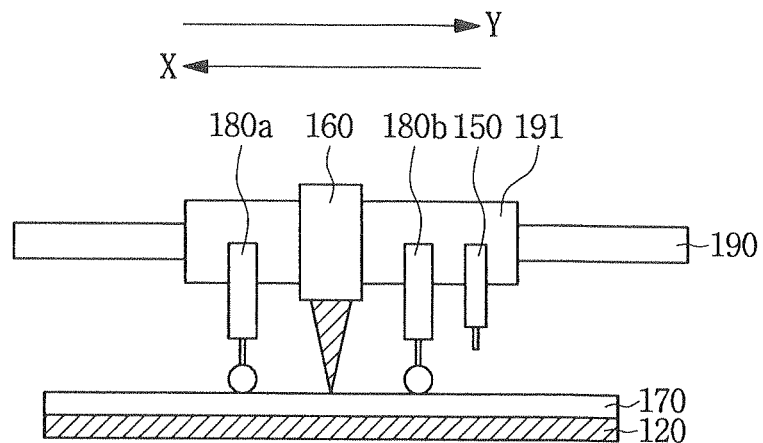
FIG. 2 is a schematic perspective view of a supporter, in which a laser welding part of the apparatus for manufacturing a mask for evaporation according to the embodiment is installed.

FIG. 2 is a schematic perspective view of a supporter, in which a laser welding part of the apparatus for manufacturing an evaporation mask according to the embodiment is installed.

The laser welding part 160 according to the embodiment and the CCD camera 150 are installed in a supporter 191. Further, a first roller 180a and a second roller 180b are installed in the supporter 191. The first roller 180a is positioned in front of the laser welding part 160, and the second roller 180b is positioned behind the laser welding part 160. Here, the front and back of the laser welding part are based on a direction, along which the supporter 191 moves. A guide bar 190 guides the movement of the supporter 191. The element 170 is the first division mask 170a or the second division mask 170b.

As shown in FIG. 2, when the supporter 191 moves along the guide bar 190 in an X direction, the first roller 180a is described as being disposed in front of the laser welding part 160, and the second roller 180b is described as being disposed behind the laser welding part 160. In this case, the first roller 180a leads the laser welding part 160, and the second roller 180b follows the laser welding part 160. Alternatively, when the supporter 191 is moved along the guide bar 190 in a Y direction, the second roller 180b is described as being disposed in front of the laser welding part 160, and the first roller 180a is described as being disposed behind the laser welding part 160. In this case, the first roller 180a follows the laser welding part 160, and the second roller 180b leads the laser welding part 160. As the references of the first and second rollers are relative, the references of the first roller and the second roller may be switched, and generally it may be described that the first roller leads the laser welding part and the second roller follows the laser welding part. The utilities of the first and second rollers 180a and 180b will be described later. Herein, the X direction or the Y direction is referred to as a welding direction, as the welding operation is performed while the welding laser part 160 moves along the welding direction.

Meanwhile, while not shown in the drawings, the apparatus for manufacturing an evaporation mask according to the embodiment may further include a vertical stage-driving member for driving the work stage 110 in a vertical direction. Due to the vertical stage-driving member, the work stage may move up or down to facilitate a loading or unloading operation of a work member, that is, a division mask. In addition, the laser welding part 160 may further include a gas supplier supplying nitrogen gas at a welding site of the division mask. However, such a driving member or gas supplier is well known in the art, and the detailed description thereof will be omitted.

Hereinafter, a method of manufacturing an evaporation mask using the apparatus for manufacturing an evaporation mask according to the embodiment will be described.

Division masks to be welded, that is, the first and second division masks 170a and 170b, are aligned on a top surface of a work stage 110. Here, fine alignment of the first and second division masks 170a and 170b may be performed using a CCD camera 150. To align the first and second division masks 170a and 170b, the work stage 110 is driven by the above-described stage-driving means, thereby loading the first and second division masks 170a and 170b to a proper welding position.

The first and second division masks 170a and 170b may be aligned on a master substrate 120, which is disposed on the work stage 110. The master substrate 120 provides reference points for the fine alignment when the division masks are disposed on the top surface of the work stage. The master substrate 120, however, may not be included. In addition, the master substrate may not be disposed on the work stage 110, but inserted into the work stage.

The first and second division masks may be aligned with a gap. In other words, there is a gap between the first division mask 170a and the second division mask 170b, and the size of the gap is about 10% or less of a thickness of the division masks. The gap G is shown in FIG. 5B.

In other words, for the alignment, sides of the first and second division masks may be in contact with each other, but a certain gap is created due to the limitations of the manufacturing apparatus and alignment technique. Thus, the gap between the first and second division masks is adjusted to about 10% or less of the thickness of the division mask, thereby ensuring good welding quality.

Subsequently, a clamp 130 disposed on the work stage 110 is arranged to fix the first division mask to the work stage 110, and another clamp is arranged to fix the second division mask to the work stage 110.

Then, a pressing plate 140 is arranged to keep the peripheral regions of the division masks to be welded close to each other, thereby performing more fine welding on the regions of the division masks to be welded.

Here, the clamp 130 and the pressing plate 140 may be moved and arranged to proper positions by using a driving member such as a motor, but an order of moving the clamp and the pressing plate is not limited.

Afterwards, a laser welding part 160 is driven to perform a welding operation. As shown in FIG. 2, the welding operation may be performed in an X or Y direction.

As described above, a first roller 180a and a second roller 180b are positioned in front of and behind the laser welding part 160, respectively, so that close adhesion between the division masks 170a and 170b and the work stage 110 may be improved during the welding operation. During the welding operation, a burr, which is created on a top surface of the division masks, may be planarized, thereby further increasing a degree of planarization of the welding part.

That is, as shown in FIG. 2, when a supporter 191 moves along a guide bar 190 in an X direction, the close adhesion between the division masks and the work stage may be improved by the first roller 180a positioned in front of the laser welding part 160. A burr created on a top surface of the division masks during the welding operation may be planarized by the second roller 180b positioned behind the laser welding part 160, thereby further increasing the degree of the planarization of the welding part. In other words, the first roller 180 leading the laser welding part 160 presses the first and second divisional masks 170a and 170b onto the work stage 110, and the second roller 180b following the laser welding part 160 planarizes the surfaces of the first and second division masks 170a and 170b.

Alternatively, when the supporter 191 is moved along the guide bar 190 in a Y direction, the close adhesion between the division masks and the work stage may be improved by the second roller 180b positioned in front of the laser welding part 160. A burr created on the top surface of the division masks during the welding operation may be planarized by the first roller 180a positioned behind the laser welding part 160, thereby further increasing the degree of the planarization of the welding part.

Here, the first and second rollers 180a and 180b may be formed along with the supporter 191 having the laser welding part 160, and thus moved along the guide bar 190 along with the laser welding part.

As described above, after driving the laser welding part 160 to perform the welding operation, the clamp 130 and the pressing plate 140 may be moved away, and the evaporation mask, which is the welded first and second division masks, may be unloaded from the work stage 110, thereby completing the evaporation mask according to the embodiment.

Hereinafter, the relationship between a beam profile of laser generated from the laser welding part and the burr will be described.

Figure 3A:
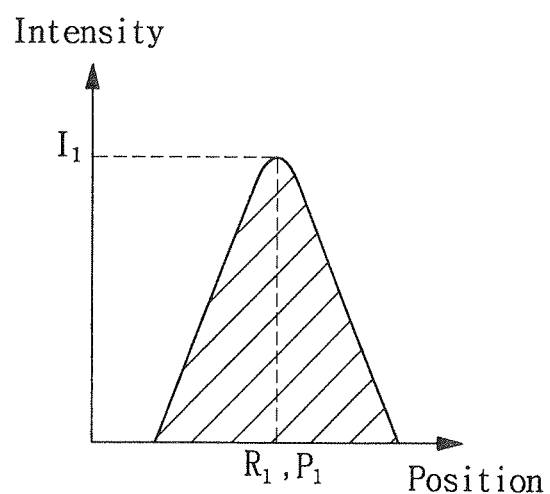
FIG. 3A shows a conventional laser beam profile.
Figure 3B:
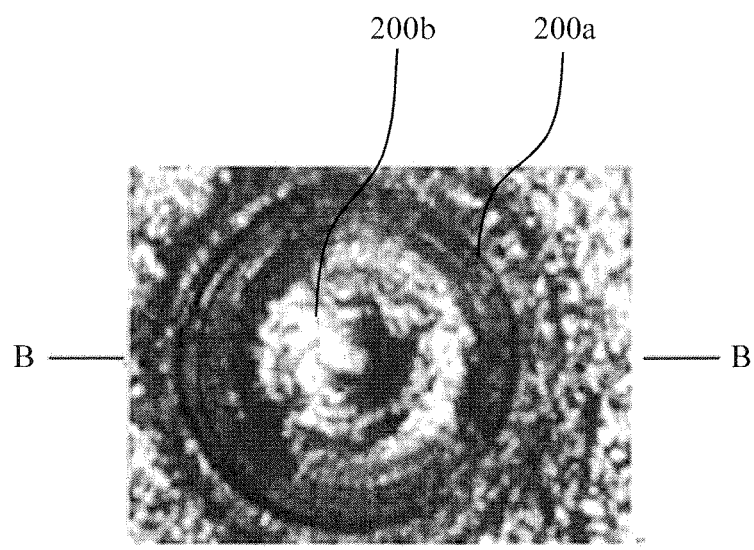
FIG. 3B is a photograph showing a part welded by the laser beam of FIG. 3A.
Figure 3C:
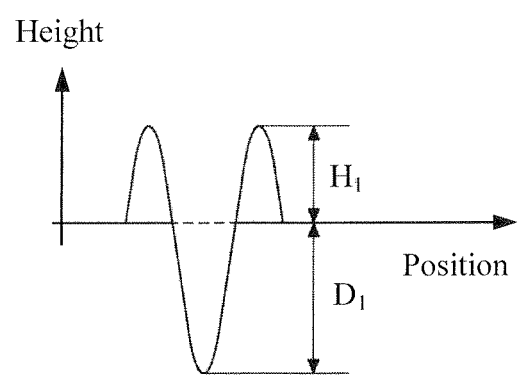
FIG. 3C is a cross-sectional view taken along a cross-sectional line B-B of FIG. 3B.

FIG. 3A shows a conventional laser beam profile showing an intensity of the laser beam as a function of a cross-sectional position of the laser beam, FIG. 3B is a photograph showing a part welded by the laser beam of FIG. 3A, and FIG. 3C is a cross-sectional view taken along a cross-sectional line B-B of FIG. 3B.

Figure 4A:
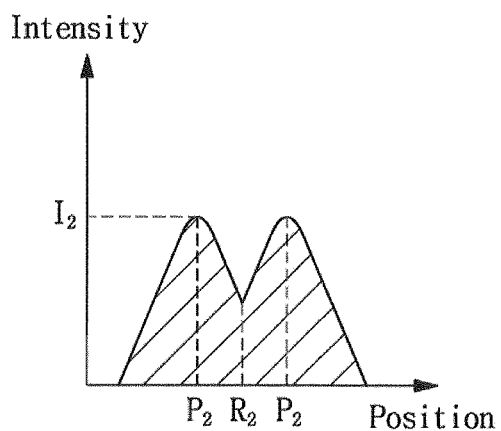
FIG. 4A shows a laser beam profile according to the embodiment.
Figure 4B:
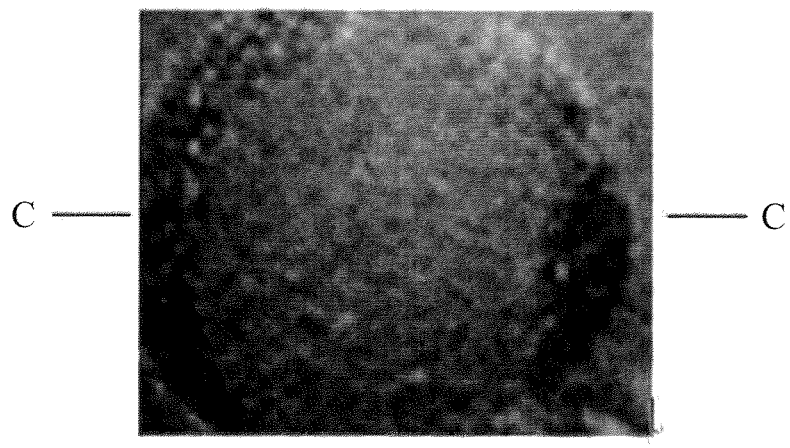
FIG. 4B is a photograph showing a part welded by the laser beam of FIG. 4A.
Figure 4C:
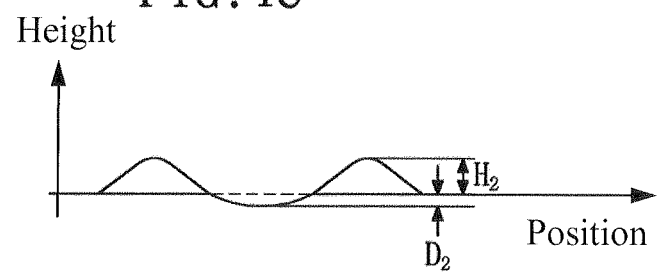
FIG. 4C is a cross-sectional view taken along a cross-sectional line C-C of FIG. 4B.

FIG. 4A shows a laser beam profile, showing an intensity of the laser beam as a function of a cross-sectional position of the laser beam, according to the embodiment, FIG. 4B is a photograph showing a part welded by the laser beam of FIG. 4A, and FIG. 4C is a cross-sectional view taken along a cross-sectional line C-C of FIG. 4B.

As known in the art, the intensity of a laser beam varies depending on a cross-sectional position of the laser beam. A graph showing the relationship between the intensity and the cross-section position of the laser beam is referred to as a laser beam profile. FIG. 3A shows a laser beam profile of a conventional laser used for a welding operation. In the conventional laser, a position $P_1$ of the maximum peak $I_1$ of the laser beam intensity corresponds to a center $R_1$ of the cross-sectional position of the laser beam.

During a welding operation, a burr may be created over the surface of the welding portion of the division masks. FIG. 3B shows a ring-shape dark region surrounding a central region (brighter region). The brighter central region corresponds to the center $R_1$ of the cross-sectional position of the laser beam. A burr $200a$ is formed in the dark region, a groove $200b$, surrounded by the burr, may be formed in the central region. FIG. 3C shows a cross-section profile of the welding portion cut along a cross-sectional line B-B of FIG. 3B. As shown in FIGS. 3B and 3C, a welding depth $D_1$, which is a depth of a groove surrounded by the burr, is formed around the position $R_1$, which is the same as the position $P_1$ in this case, having the maximum peak I1 of the laser beam intensity. A burr is created to have a height $H_1$. The base line for the definitions of the depth $D_1$ and height $H_1$ shown in FIG. 3C is the top surface of the division masks, as shown in FIG. 5B. Through experiments, it is observed that as the laser beam intensity increases, both of the welding depth $D_1$ of the groove and the height $H_1$ of the burr increase.

Referring to FIG. 4A, in the laser beam profile according to the embodiment, a position $P_2$, in which a laser beam intensity has the maximum peak $I_2$, does not correspond with a center $R_2$ of the laser beam. There may be a plurality of positions $P_2$ in which a laser beam intensity has the maximum peak $I_2$. As shown in FIG. 4A, none of the maximum peaks may be at around a center $R_2$ of the beam profile of the laser.

In this case, when the same output of lasers is applied, the laser beam intensity at the maximum peak $I_2$ according to the laser beam profile of the present invention is lower than that at the maximum peak $I_1$ according to the conventional laser beam profile shown in FIG. 3A. That is, in the embodiment, due to the plurality of positions $P_2$ in which the laser beam intensity has the maximum peak $I_2$, the laser beam intensity at the maximum peak is reduced, thereby forming a lower welding depth than that in the conventional case.

Referring to FIGS. 4B and 4C, the welding depth $D_2$ is lower than the conventional depth, and thus the height $H_2$ of the burr becomes lower. FIG. 4B, comparing with the photo in FIG. 3B, shows no distinctive burr and groove.

Here, the height $H_2$ of the burr may be about 10 μm or less. When the height of the burr is more than 10 μm, a shadow effect occurs, so that it is difficult to perform uniform evaporation. As the height of the burr increases, the welding depth becomes larger, resulting in a smaller welded portion between the first division mask and the second division mask. Accordingly, a welding strength is also decreased.

Meanwhile, the output of the laser is not limited, and thus can be randomly adjusted according to the thickness of the division mask to be welded. However, it is important to form the burr on the top surface of the division mask to have a height of about 10 μm or less. To this end, the plurality of positions $P_2$, in which the laser beam intensity has the maximum peak $I_2$, are created, thereby controlling the intensity of the laser beam applied to the division mask.

Figure 5A:
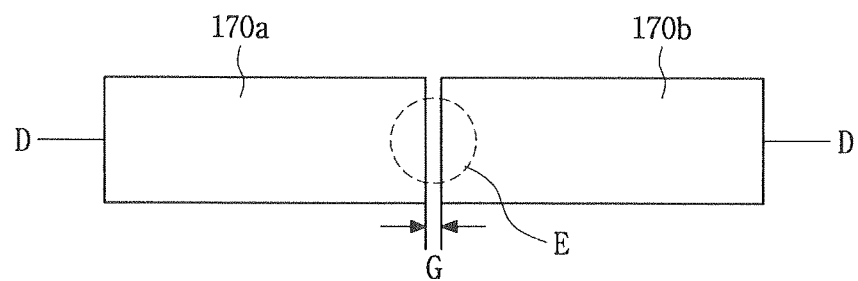
FIG. 5A is a schematic plan view of a mask for evaporation according to the embodiment.
Figure 5B:
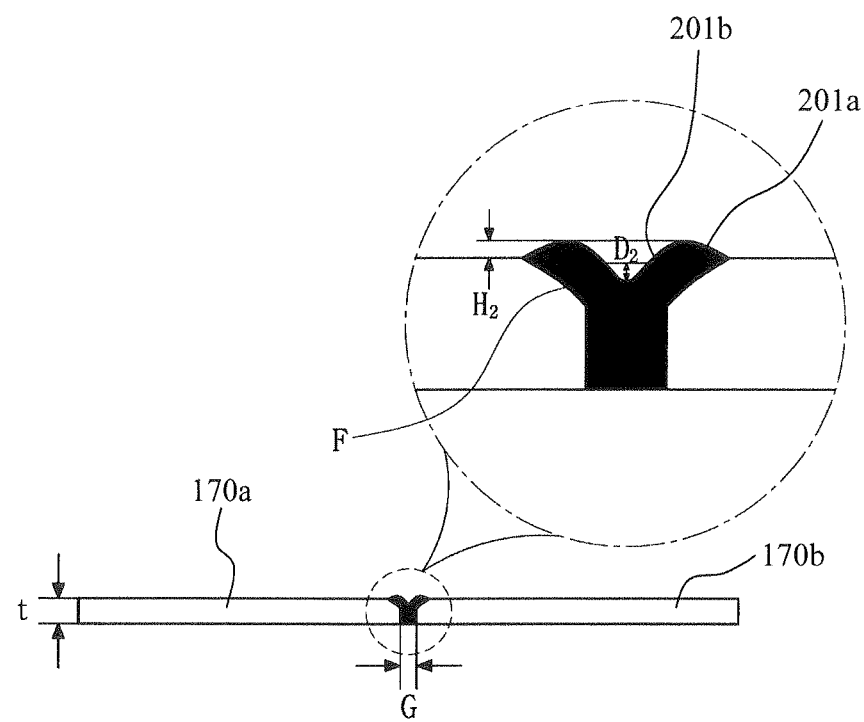
FIG. 5B is a cross-sectional view taken along a cross-sectional line D-D of FIG. 5A.
Figure 5C:
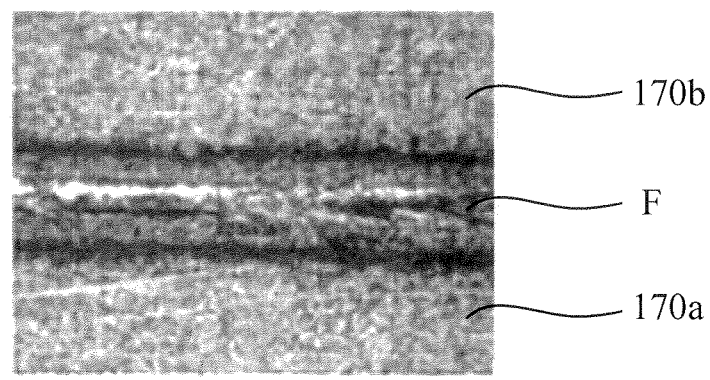
FIG. 5C is an enlarged photograph of region E of FIG. 5A.

FIG. 5A is a schematic plan view of an evaporation mask according to the embodiment, FIG. 5B is a cross-sectional view taken along a cross-sectional line D-D of FIG. 5A, and FIG. 5C is an enlarged photograph of region E of FIG. 5A.

Referring to FIGS. 5A through 5C, a single evaporation mask is formed by directly bonding two division masks $170a$ and $170b$ by welding. While the two division masks are illustrated in the drawings, at least two division masks may be directly bonded by welding. That is, the number of the division masks is not limited in the present invention.

Here, in a conventional method, a mask frame may be quartered into a lattice-type subframe and a division mask is disposed to correspond to each divided opening of the subframe. Thus, when the division mask is bonded to the subframe by welding, a top surface of the subframe faces a top surface of the division mask, so that a welding surface is created between the top surface of the subframe and the top surface of the division mask.

However, in the embodiment, welding surfaces are side surfaces of the division masks, because a plurality of division masks are disposed on the work stage 110, while side surfaces of the division masks face one another and are directly bonded by welding, not being bonded by welding using such a subframe.

Accordingly, in the conventional art, even if a large-sized evaporation mask is manufactured by bonding the plurality of division masks through welding, due to the thickness of the subframe, the planarization of the evaporation mask has less effective, and the shadow effect caused by the subframe occurs, thereby causing difficulty in ensuring uniform evaporation.

However, in the embodiment, since the division masks are directly bonded by welding without using the subframe, the shadow effect does not occur. Though the burr is created on the top surface of the division mask during the welding operation, when the height of the burr is adjusted to about 10 μm or less, the shadow effect caused by the burr may be prevented.

Here, the first and second division masks according to the embodiment are bonded by welding with a gap G of about 10% or less of the thickness t of the division mask.

As described above, the side surfaces of the first and second division masks are aligned to contact with each other, but it is inevitable that a certain size of gap is created between the side surfaces of the division masks due to the limitations of the manufacturing apparatus and alignment techniques. In addition, as the gap between the division mask becomes larger, it becomes more difficult to directly bond the division masks by welding, and the welding strength is decreased.

Thus, in the embodiment, the gap G between the first and second division masks is designed to be about 10% or less of the thickness t of the division mask, and thus good welding quality can be ensured.

Subsequently, referring to FIG. 5B, as shown in the enlarged view of FIG. 5B, the evaporation mask according to the embodiment has a welding portion F, which is formed between the side surface of the first division mask 170a and the side surface of the second division mask 170b. The first division mask 170a and the second division mask 170b are bonded together through the welding portion F. The welding portion F may have a burr 201a and a groove 201b surrounded by the burr 201a. The burr 201a may be formed around an interface between the welding portion and the first division mask 170a and around an interface between the welding portion and the second division mask 170b. The burr 201a may protrude by the height $H_2$ from the top surface of the division mask, and the groove 201b may be formed by the welding depth $D_2$ from the top surface of the division mask.

FIG. 5C shows a photograph of the enlarged region E after a welding operation, viewed from the top of the division masks 170a and 170b. The welding portion F is formed between the first division mask 170a and the second division mask 170b after the welding operation. In this photo, the welding portion F had a smooth top surface, which indicates that the burr is well controlled under desired height. Breaking strength of the evaporation mask after the welding operation is measured at 39.6 kgf/mm$^2$, which is a much higher than the allowable strength of 6.34 kgf/mm$^2$.

Consequently, deposition masks according to the embodiment do not use a subframe, and are directly bonded to one another by welding, so that a shadow effect occurring in the conventional art does not occur, and very good welding quality with respect to a breaking strength can be ensured.

Although the present invention has been described with reference to predetermined exemplary embodiments thereof, it will be understood by those skilled in the art that a variety of modifications and variations may be made to the present invention without departing from the spirit or scope of the present invention defined in the appended claims and their equivalents.

What is claimed is:

1. A method of manufacturing a mask for evaporation, comprising:
    disposing a master substrate on a top surface of a work stage;
    disposing a first division mask and a second division mask on the master substrate;
    aligning the first division mask and the second division mask by using a camera installed in a supporter moving along a guide bar;
    fixing the first and second division masks to the master substrate with a first clamp and a second clamp, respectively, which are disposed on the work stage, each of the first division mask and the second division mask directly contacting the master substrate, an air gap being formed between the first division mask and the second division mask, the first clamp directly contacting the first division mask and the master substrate, the second clamp directly contacting the second division mask and the master substrate;
    disposing a pressing plate on peripheral regions of the first and second division masks to be welded, the first and second division masks being disposed between the pressing plate and the master substrate;
    pressing the first and second division masks onto the master substrate with a first roller installed in the supporter while moving into a welding direction;
    applying a laser beam generated from a laser welding part installed in the supporter to the air gap between the first and second division masks to weld the first division mask to the second division mask, a beam profile of the laser beam generated from the laser welding part having a plurality of maximum peaks, the beam profile being defined as an intensity of the laser beam as a function of a cross-sectional position to be welded, wherein a welding portion is formed between the first division mask and the second division mask after welding the first division mask to the second division mask; and
    planarizing a top surface of the welding portion with a second roller installed in the supporter while moving into a welding direction, the second roller following the laser welding part, the laser welding part installed between in the first roller and the second roller.

2. The method according to claim 1, wherein the disposing the first division mask and the second division mask comprises:
    disposing the master substrate on a top surface of a work stage.

3. The method according to claim 1, wherein the air gap is about 10% or less of a thickness of the first division mask.

4. The method according to claim 1, further comprising pressing the first and second division masks onto the master substrate with a first roller while moving into a welding direction, the first roller leading the laser welding part.

5. The method according to claim 1, wherein a welding portion is formed between the first division mask and the second division mask after welding the first division mask to the second division mask, the method further comprising planarizing a top surface of the welding portion with a second roller while moving into a welding direction, the second roller following the laser welding part.

6. An apparatus for manufacturing a mask for evaporation, comprising:
    a master substrate on which a first division mask and a second division mask are disposed, the master substrate disposed on a top surface of a work stage;
    a camera installed in a supporter moving along a guide bar to align the first division mask and the second division mask;
    a first clamp and a second clamp disposed on the work stage to respectively fix the first division mask and the second division mask to a surface of the master substrate in a manner that an air gap is formed between the first division mask and the second division mask, the first clamp directly contacting the first division mask and the master substrate, the second clamp directly contacting the second division mask and the master substrate;
    a pressing plate disposed on peripheral regions of the first and second division masks, the pressing plate pressing the first and second division masks onto the master substrate;
    a first roller installed in the supporter to press the first and second division masks onto the master substrate while the first roller is moving into a welding direction;
    a laser welding part disposed above the first and second division masks, the laser welding part disposed on the air gap between the first division mask and the second division mask to apply a laser beam generated from the laser welding part to the air gap between the first and second division masks to weld the first division mask to the second division mask, a beam profile of the laser beam generated from the laser welding part having a plurality of maximum peaks, the beam profile being defined as an intensity of the laser beam as a function of a cross-sectional position to be welded; and
    a second roller installed in the supporter to planarize a top surface of the welding portion while the second roller is moving into a welding direction, the second roller following the laser welding part, the laser welding part installed between in the first roller and the second roller.

7. The apparatus according to claim 6, further comprising a work stage on which the first and second division masks and the master substrate are disposed.

8. The apparatus according to claim 6, wherein none of the maximum peaks is at around a center of the beam profile of the laser beam.

9. The apparatus according to claim 6, further comprising a first roller positioned in front of the laser welding part and a second roller positioned behind the laser welding part, the first and second rollers disposed on the first and second division masks.

10. The apparatus according to claim 9, further comprising a supporter, the laser welding part and the first and second rollers being installed in the supporter.

11. The apparatus according to claim 10, wherein the supporter moves along a welding direction while welding the first division mask to the second division mask, the first roller leading the laser welding part and pressing the first and second division masks onto the master substrate, the second roller following the laser welding part and planarizing a surface of a welding portion formed between the first and second division masks during the welding the first division mask to the second division mask.

* * * * *